US012667189B2

(12) United States Patent
Chen et al.

(10) Patent No.: US 12,667,189 B2
(45) Date of Patent: Jun. 30, 2026

(54) SLIDE RAIL ASSEMBLY

(71) Applicants: King Slide Works Co., Ltd., Kaohsiung City (TW); King Slide Technology Co., Ltd., Kaohsiung City (TW)

(72) Inventors: Ken-Ching Chen, Kaohsiung City (TW); Shun-Ho Yang, Kaohsiung City (TW); Kai-Wen Yu, Kaohsiung City (TW); Chun-Chiang Wang, Kaohsiung City (TW)

(73) Assignees: King Slide Works Co., Ltd., Kaohsiung City (TW); King Slide Technology Co., Ltd., Kaohsiung City (TW)

(*) Notice: Subject to any disclaimer, the term of this patent is extended or adjusted under 35 U.S.C. 154(b) by 169 days.

(21) Appl. No.: 18/733,211

(22) Filed: Jun. 4, 2024

(65) Prior Publication Data

US 2025/0176714 A1 Jun. 5, 2025

(30) Foreign Application Priority Data

Dec. 1, 2023 (TW) .................................. 112147136

(51) Int. Cl.
*A47B 88/49* (2017.01)
*A47B 88/473* (2017.01)
(Continued)

(52) U.S. Cl.
CPC ............ *A47B 88/477* (2017.01); *A47B 88/49* (2017.01); *A47B 88/57* (2017.01);
(Continued)

(58) Field of Classification Search
CPC ..... A47B 88/483; A47B 88/473; A47B 88/49; A47B 88/50; A47B 88/477;
(Continued)

(56) References Cited

U.S. PATENT DOCUMENTS

| | | | |
|---|---|---|---|
| 6,935,710 | B2 | 8/2005 | Chen et al. |
| 12,127,673 | B2 | 10/2024 | Chen et al. |

(Continued)

FOREIGN PATENT DOCUMENTS

| | | |
|---|---|---|
| EP | 3679833 A1 | 7/2020 |
| TW | I818694 B | 10/2023 |
| WO | 2019/152314 A1 | 8/2019 |

*Primary Examiner* — Kimberley S Wright
(74) *Attorney, Agent, or Firm* — Best & Flanagan LLP

(57) ABSTRACT

A slide rail assembly includes a first rail, a second rail, a third rail, a first working member, a second working member, an operating member and a handle. During a process of the handle being moved to switch from a first state to a second state, the operating member is driven to move the second working member to switch from a first working state to a second working state. When the second rail is moved along an opening direction to an extended position, the first working member in the first working state and a blocking feature block each other to prevent the second rail from being further moved along the opening direction, and the second working member in the second working state and a second blocking wall of the blocking feature do not block each other to allow the second rail to be moved along a retracting direction.

21 Claims, 12 Drawing Sheets

(51) Int. Cl.

| | |
|---|---|
| *A47B 88/477* | (2017.01) |
| *A47B 88/57* | (2017.01) |
| *H05K 7/14* | (2006.01) |
| *A47B 88/423* | (2017.01) |

(52) U.S. Cl.
CPC ..... *A47B 2088/4235* (2017.01); *A47B 88/473* (2017.01); *A47B 2210/0016* (2013.01); *A47B 2210/0018* (2013.01); *H05K 7/1489* (2013.01)

(58) Field of Classification Search
CPC .... A47B 2088/4235; A47B 2210/0018; A47B 2210/0016; H05K 7/1489
See application file for complete search history.

(56) References Cited

U.S. PATENT DOCUMENTS

| | | | |
|---|---|---|---|
| 2005/0162052 A1* | 7/2005 | Chen ..................... | A47B 88/497 |
| | | | 312/334.5 |
| 2018/0295992 A1* | 10/2018 | Chen ..................... | A47B 88/473 |
| 2019/0200756 A1* | 7/2019 | Chen ..................... | A47B 88/473 |
| 2019/0298060 A1* | 10/2019 | Chen ..................... | A47B 88/483 |
| 2020/0214444 A1* | 7/2020 | Chen ..................... | A47B 88/473 |
| 2020/0253082 A1 | 8/2020 | Yu et al. | |
| 2022/0065292 A1* | 3/2022 | Chen ..................... | A47B 88/44 |
| 2022/0192376 A1* | 6/2022 | Chen ..................... | A47B 88/57 |
| 2024/0065438 A1* | 2/2024 | Chen ..................... | A47B 88/483 |

* cited by examiner

SLIDE RAIL ASSEMBLY

BACKGROUND OF THE INVENTION

1. Field of the Invention

The present invention relates to a slide rail mechanism, and more particularly, to a slide rail assembly having a handle.

2. Description of the Prior Art

U.S. Pat. No. 6,935,710 B2 discloses a two-way retainer for a slide rail assembly. The two-way retainer comprises a retaining mechanism mounted on a first rail, and a stop member mounted on a second rail. The retaining mechanism is at least arranged with two retaining arms and an elastic member abutting against each other. Each of the two retaining arms is arranged with an inclined portion and an engaging portion correspondingly. The stop member is arranged with a stop portion. When the first rail is pulled to a predetermined operating position, the stop portion of the stop member on the second rail is configured to cross the inclined portion of one of the retaining arms on the first rail to be engaged between the engaging portions of the retaining arms for two-way retaining. A user can operate an unlatching member to drive the two retaining arms to rotate in order to disable two-way retaining between the retaining arms and the stop portion on the second rail.

The aforementioned patent discloses the unlatching member for driving the two retaining arms to move. However, for different market requirements, it is important to develop various slide rail products.

SUMMARY OF THE INVENTION

The present invention relates to a slide rail assembly having a handle.

According to an embodiment of the present invention, a slide rail assembly comprises a first rail, a second rail, a third rail, a first working member, a second working member, an operating member and a handle. The second rail is movable relative to the first rail. The third rail is movably mounted between the first rail and the second rail. The third rail is arranged with a blocking feature, and the blocking feature has a first blocking wall and a second blocking wall. The first working member and the second working member are movably mounted to the second rail and configured to be in one of a first working state and a second working state. The operating member is configured to drive the second working member to move. The handle is movable relative to the second rail to switch between a first state and a second state. During a process of the handle being moved to switch from the first state to the second state, the operating member is configured to be moved from a first operating position to a second operating position in order to further drive the second working member to move to switch from the first working state to the second working state. When the third rail is located at a predetermined opening position relative to the first rail and when the second rail is moved relative to the third rail along an opening direction to a fully extended position, the first working member in the first working state and the first blocking wall of the blocking feature are configured to block each other in order to prevent the second rail from being further moved along the opening direction from the fully extended position, and the second working member in the second working state and the second blocking wall of the blocking feature do not block each other in order to allow the second rail to be moved from the fully extended position along a retracting direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
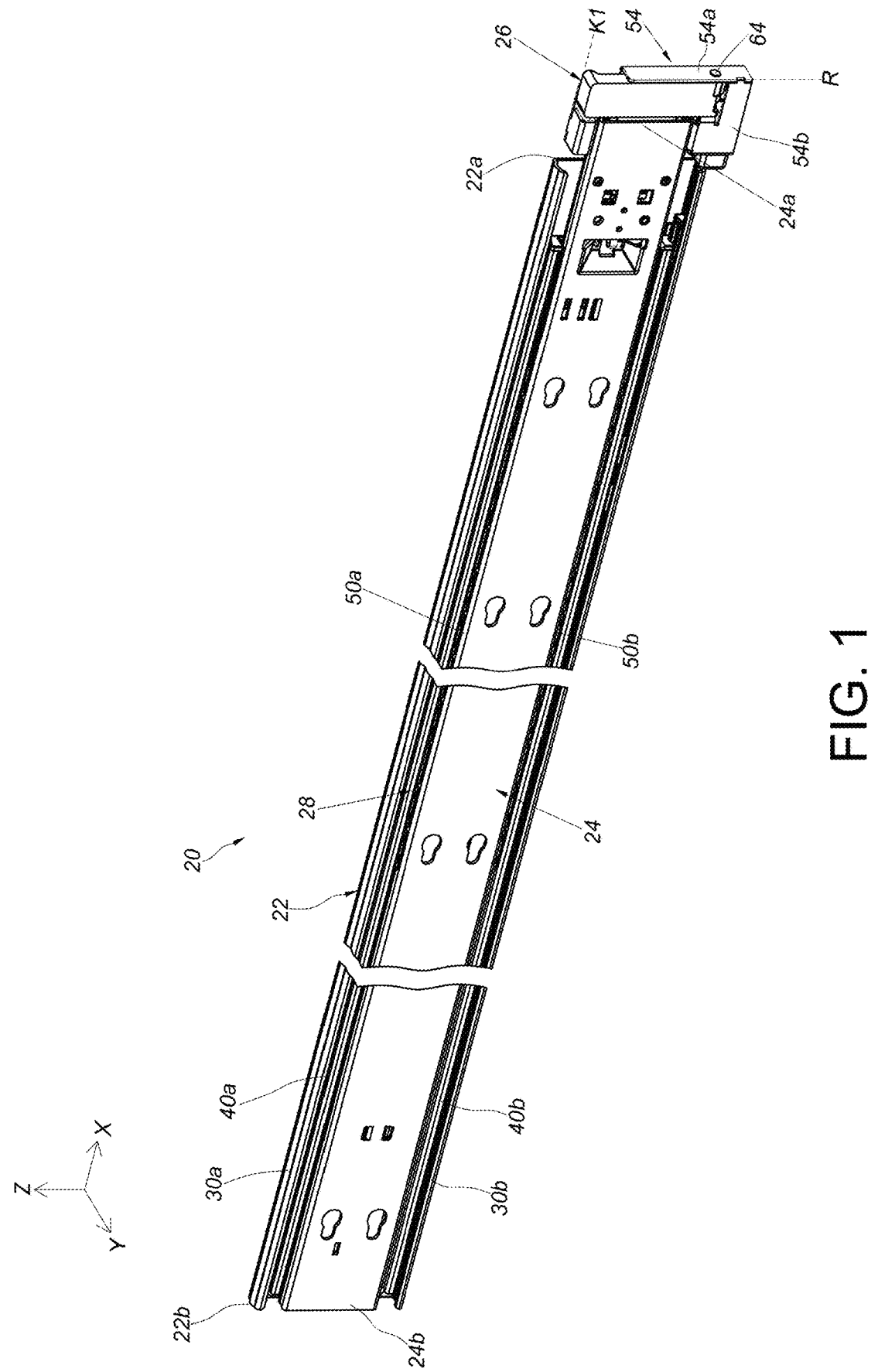
FIG. 1 is a diagram showing a slide rail assembly according to an embodiment of the present invention.
Figure 2:
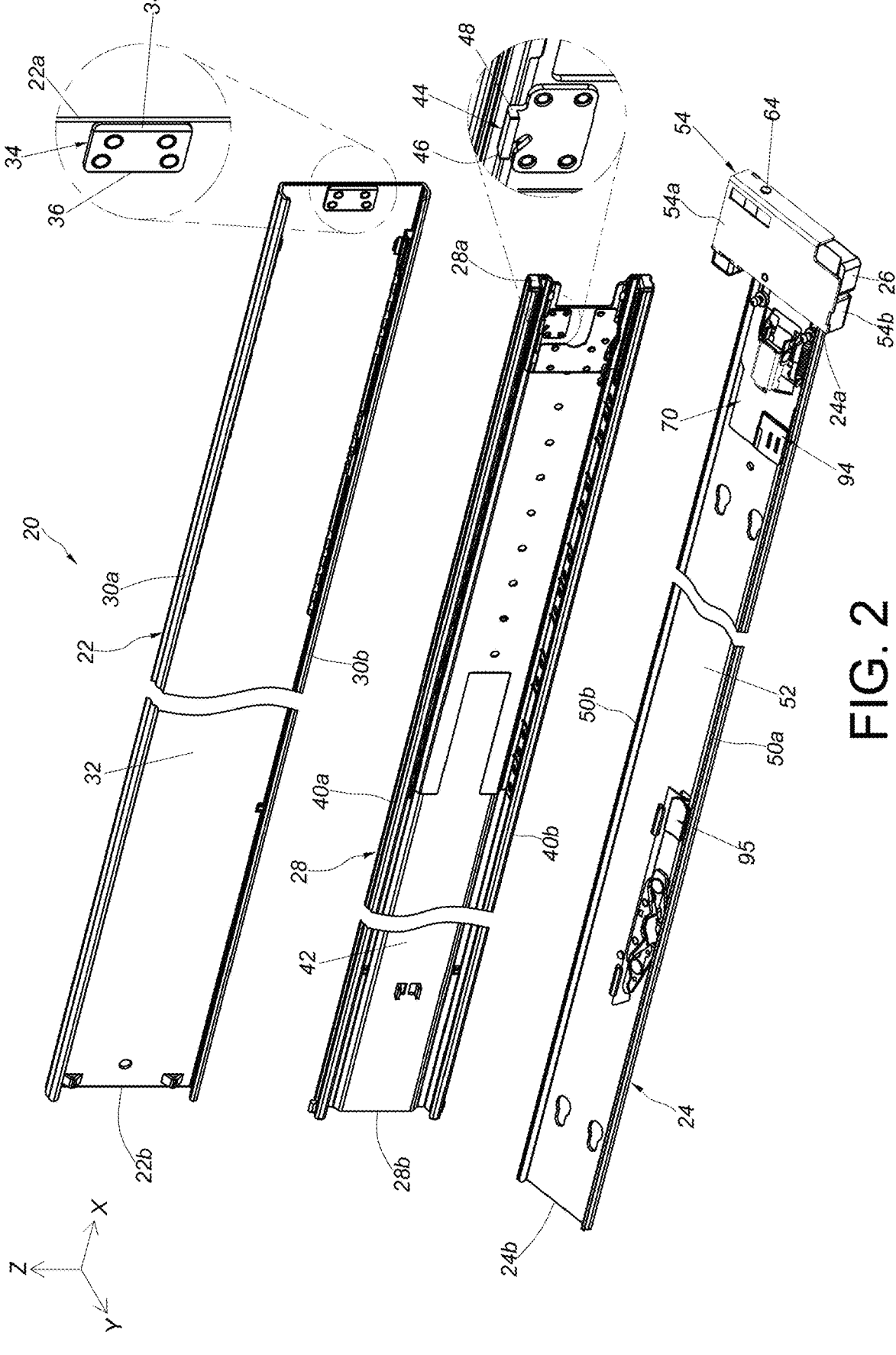
FIG. 2 is an exploded view of the slide rail assembly according to an embodiment of the present invention.

As shown in FIG. 1 and FIG. 2, a slide rail assembly 20 comprises a first rail 22 (such as an outer rail), a second rail 24 (such as an inner rail) and a handle 26. Preferably, the slide rail assembly 20 further comprises a third rail 28 (such as a middle rail) movably mounted between the first rail 22 and the second rail 24. The second rail 24 is located at a retracted position R relative to the first rail 22 shown in FIG. 1. The second rail 24, the third rail 28 and the first rail 22 are longitudinally movable relative to each other. In the figures, the X axis is a longitudinal direction (or a length direction or a moving direction of the slide rail), the Y axis is a transverse direction (or a lateral direction of the slide rail), and the Z axis is a vertical direction (or a height direction of the slide rail.

The first rail 22 has a first end part 22a and a second end part 22b opposite to each other, such as a front end part and a rear end part, but the present invention is not limited thereto. The first rail 22 comprises a first wall 30a, a second wall 30b and a longitudinal wall 32 connected between the first wall 30a and the second wall 30b of the first rail 22. Preferably, the first rail 22 further comprises a blocking part 34. In the present embodiment, the blocking part 34 is a protrusion protruded relative to the longitudinal wall 32 of the first rail 22, but the present invention is not limited thereto. The blocking part 34 is arranged adjacent to the first end part 22a of the first rail 22. The blocking part 34 has a blocking section 36 and a guiding section 38 opposite to each other. The blocking section 36 is located adjacent to a rear end of the blocking part 34, and the guiding section 38 is located adjacent to a front end of the blocking part 34. The guiding section 38 has an inclined surface or an arc surface.

The third rail 28 has a first end part 28a and a second end part 28b opposite to each other, such as a front end part and a rear end part, but the present invention is not limited thereto. The third rail 28 comprises a first wall 40a, a second wall 40b and a longitudinal wall 42 connected between the first wall 40a and the second wall 40b of the third rail 28. Preferably, the third rail 28 further comprises a blocking feature 44. In the present embodiment, the blocking feature 44 is a protrusion protruded relative to the longitudinal wall 42 of the third rail 28, but the present invention is not limited thereto. The blocking feature 44 is arranged adjacent to the first end part 28a of the third rail 28. The blocking feature 44 has a first blocking wall 46 and a second blocking wall 48 opposite to each other. For example, the first blocking wall 46 is located adjacent to a rear end of the blocking feature 44, and the second blocking wall 48 is located adjacent to a front end of the blocking feature 44.

The second rail 24 has a first end part 24a and a second end part 24b opposite to each other, such as a front end part and a rear end part, but the present invention is not limited thereto. The second rail 24 comprises a first wall 50a, a second wall 50b and a longitudinal wall 52 connected between the first wall 50a and the second wall 50b of the second rail 24. Preferably, a housing 54 is connected (such as fixedly connected) to the second rail 24, such that the housing 54 can be seen as a part of the second rail 24. The housing 54 comprises a first housing part 54a and a second housing part 54b configured to cover most of related components arranged on the housing 54 for protection. Preferably, the housing 54 is adjacent to the first end part 24a of the second rail 24.

Figure 3:
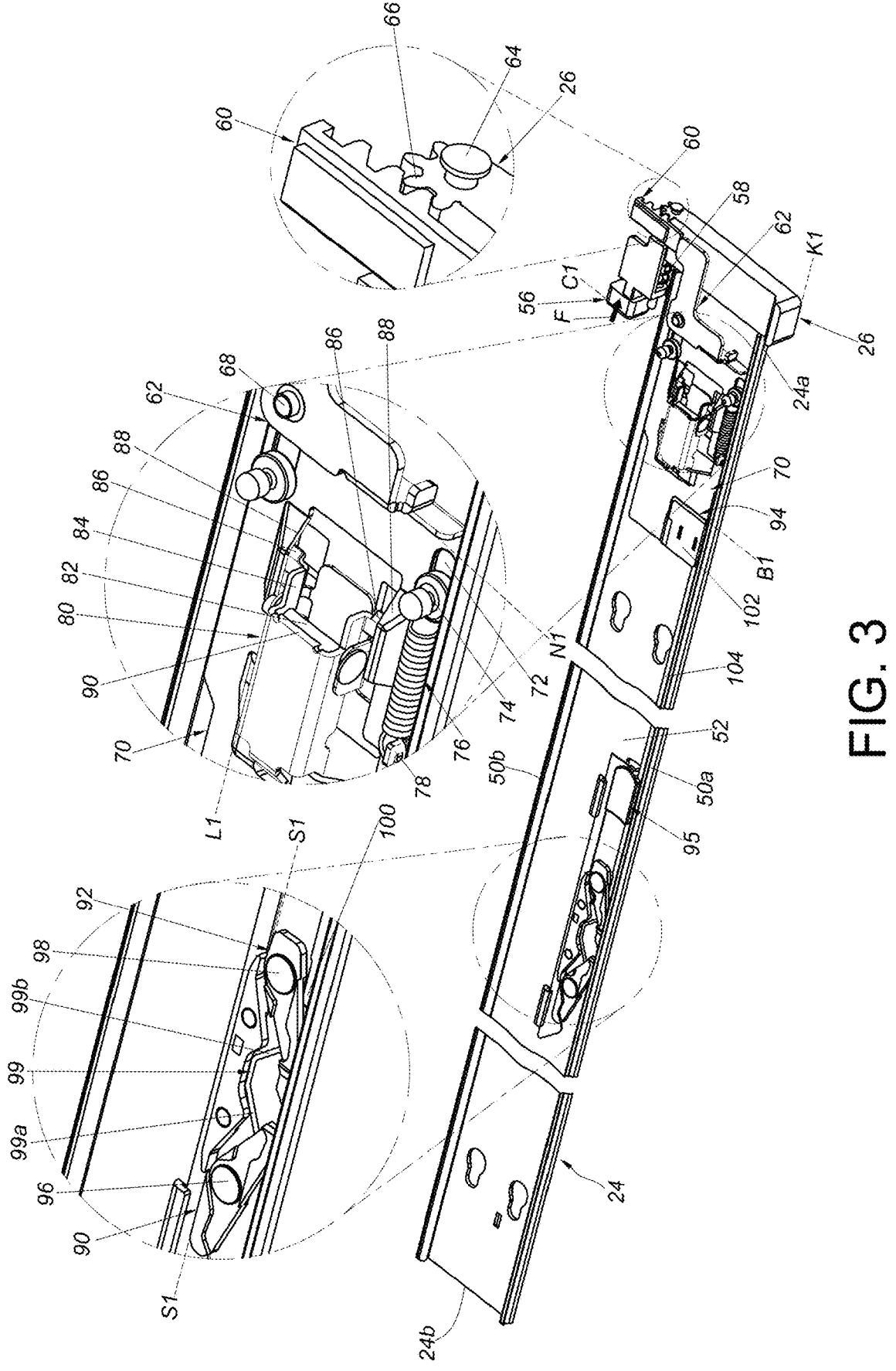
FIG. 3 is a diagram showing the second rail and a handle being in a first state from a viewing angle according to an embodiment of the present invention.

As shown in FIG. 3, the casing 54 is omitted in FIG. 3, and the related components arranged on the housing 54 are the handle 26, an auxiliary member 56, and an elastic feature 58. Preferably, a gear rack 60, an actuating member 62 and a shaft member 64 are also arranged on the housing 54.

The handle 26 is pivoted relative to the second rail 24 through the shaft member 64. In the present embodiment, the shaft member 64 is configured to pivotally connect the handle 26 to the housing 54, but the present invention is not limited thereto. The shaft member 64 is arranged in a direction substantially identical to a length direction or a moving direction of the second rail 24 (such as the longitudinal direction) relative to the first rail 22.

Figure 4:
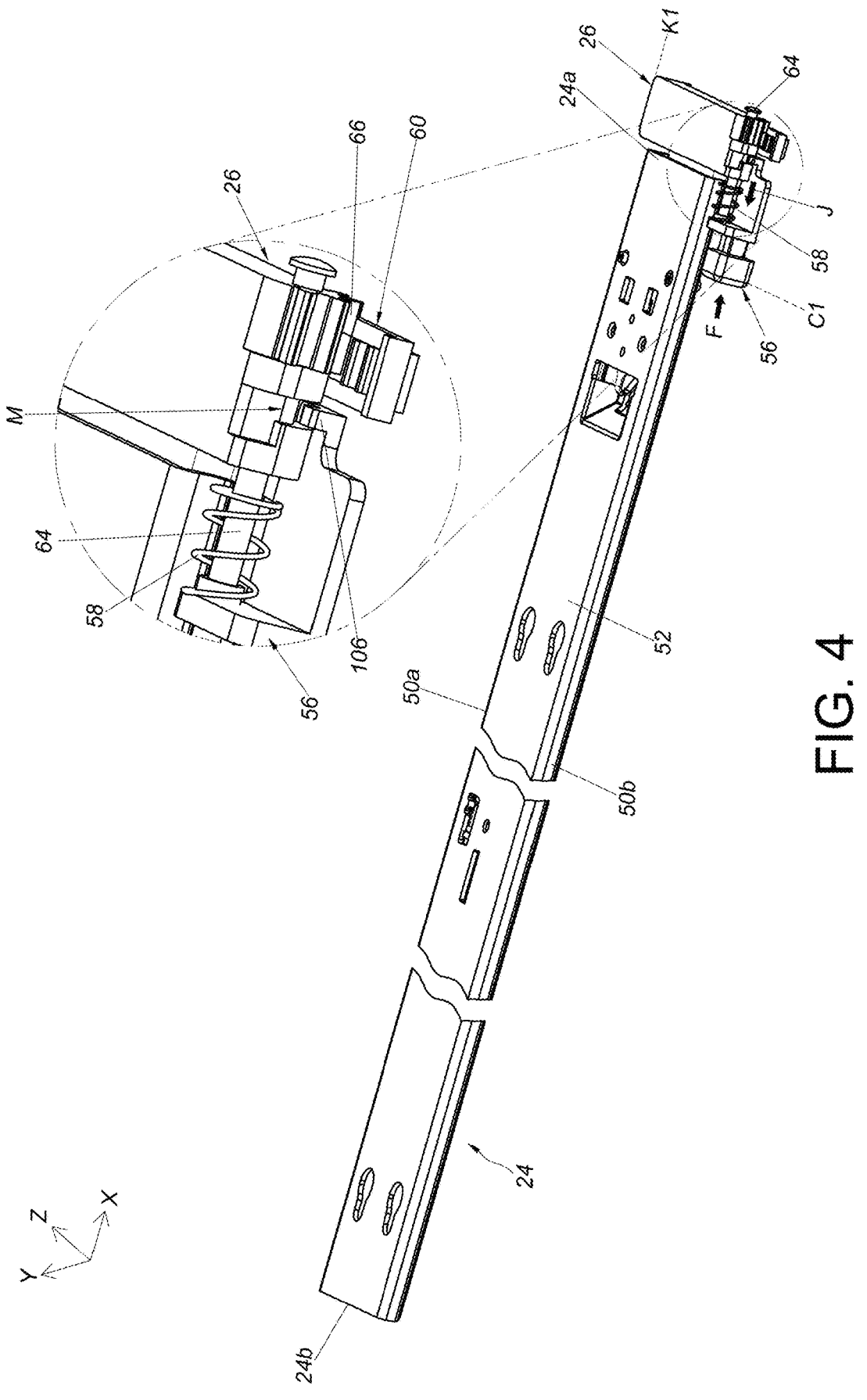
FIG. 4 is a diagram showing the second rail and the handle being in the first state from another viewing angle according to an embodiment of the present invention.

As shown in FIG. 3 and FIG. 4, the auxiliary member 56 is arranged on the second rail 24. For example, the auxiliary member 56 is arranged on the housing 54 on the second rail 24 (please also refer to FIG. 2). Preferably, the shaft member 64 is configured to pass through the auxiliary member 56, such that the auxiliary member 56 is (longitudinally) movable relative to the shaft member 64, and the elastic feature 58 is configured to provide an elastic force to the auxiliary member 56. The elastic feature 58 is configured to abut between the auxiliary member 56 and the housing 54.

Preferably, the gear rack 60 is movable relative to the second rail 24. For example, the gear rack 60 is movably mounted to the housing 54 on the second rail 24. Furthermore, the gear rack 60 is movable along the height direction relative to the second rail 24 (or the housing 54). The handle 26 is arranged with a gear structure 66 configured to mesh with the gear rack 60.

Preferably, the actuating member 62 is movable relative to the second rail 24. For example, the actuating member 62 is pivoted to the housing 54 on the second rail 24 through a shaft part 68. The shaft part 68 is arranged in a direction substantially identical to a transverse direction (or a lateral direction) of the second rail 24.

Preferably, the slide rail assembly 20 further comprises a driving member 70 movable relative to the second rail 24. The driving member 70 and the second rail 24 are movable relative to each other within a limited range through interaction between a first limiting feature 72 and a second limiting feature 74. For example, the first limiting feature 72 is a longitudinal elongated hole (or a longitudinal elongated slot), and the second limiting feature 74 is a connecting member (or a connecting pin) passing through a portion of the longitudinal elongated hole.

Preferably, the slide rail assembly 20 further comprises an elastic member 76. In the present embodiment, the elastic member 76 is connected between the driving member 70 and the second rail 24, but the present invention is not limited thereto. Furthermore, two ends of the elastic member 76 are respectively connected to a mounting section 78 on the driving member 70 and the second limiting feature 74 on the second rail 24.

Preferably, the slide rail assembly 20 further comprises a locking member 80 movably mounted on the second rail 24. For example, the locking member 80 is pivoted to at least one lug 84 on the second rail 24 through an auxiliary shaft 82. The auxiliary shaft 82 is arranged in a direction substantially identical to a height direction of the second rail 24.

Preferably, the locking member 80 and the driving member 70 respectively have a first corresponding feature 86 and a second corresponding feature 88 configured to interact with each other. At least one of the first corresponding feature 86 and the second corresponding feature 88 has an inclined surface or an arc surface to facilitate relative movement between the first corresponding feature 86 and the second corresponding feature 88.

Preferably, the slide rail assembly 20 further comprises a first working member 90, a second working member 92 and an operating member 94 movably mounted on the second rail 24. The first working member 90 and the second working member 92 are pivoted to the second rail 24 (the longitudinal wall 52 of the second rail 24) through a first mounting shaft 96 and a second mounting shaft 98 respectively. The slide rail assembly 20 further comprises at least one auxiliary elastic part 99. The first working member 90 and the second working member 92 are configured to be held in a first working state S1 in response to elastic forces of a first elastic section 99a and a second elastic section 99b of the auxiliary elastic part 99 respectively. The operating member 94 is configured to drive the second working member 92 to move. Furthermore, the operating member 94 comprises a driving section 100, an operating section 102 and a longitudinal section 104 connected between the driving section 100 and the operating section 102. The driving section 100 corresponds to the second working member 92. For example, the driving section 100 is operatively connected to the second working member 92 to drive the second working member 92 to move. On the other hand, the operating section 102 is connected to the driving member 70, such that the operating member 94 is configured to be moved along with the driving member 70.

As shown in FIG. 3 and FIG. 4, the auxiliary member 56 comprises an engaging feature 106, such as a protrusion part or an extension part, but the present invention is not limited thereto. The handle 26 is in a first state K1 relative to the second rail 24. On the other hand, when a force F is applied to the auxiliary member 56 or when the auxiliary member 56 abuts against an object (such as the first rail 22), the auxiliary member 56 is configured to be located at a first auxiliary position C1 relative to the second rail 24, and the elastic feature 58 is configured to accumulate a predetermined elastic force J. When the auxiliary member 56 is located at the first auxiliary position C1, the engaging feature 106 of the auxiliary member 56 is located at a position corresponding to a predetermined space M (as shown in FIG. 4) of the handle 26 in the first state K1. As such, the handle 26 can be moved by a user to be no longer in the first state K1.

Figure 5:
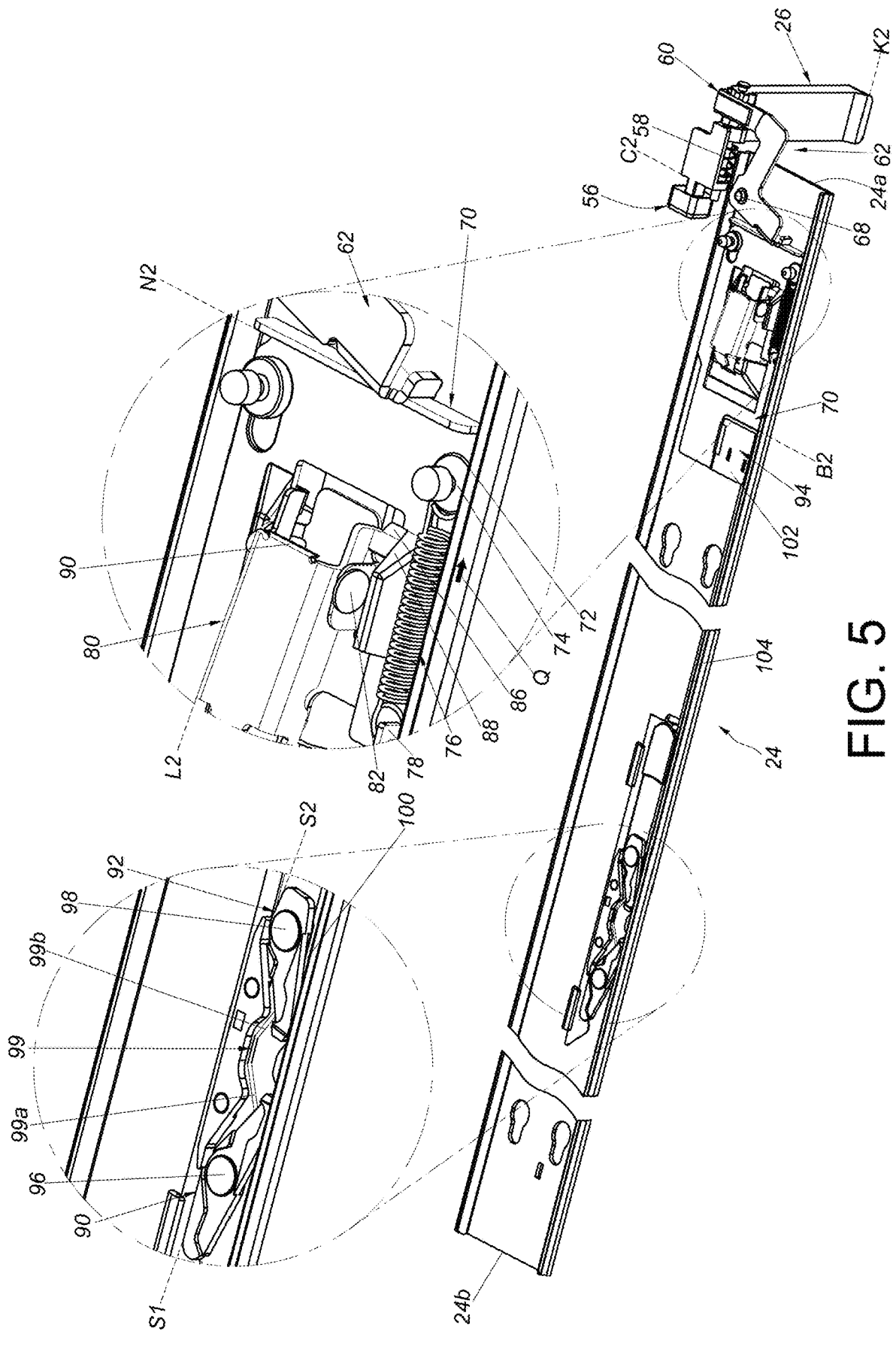
FIG. 5 is a diagram showing the second rail and the handle being in a second state from a viewing angle according to an embodiment of the present invention.
Figure 6:
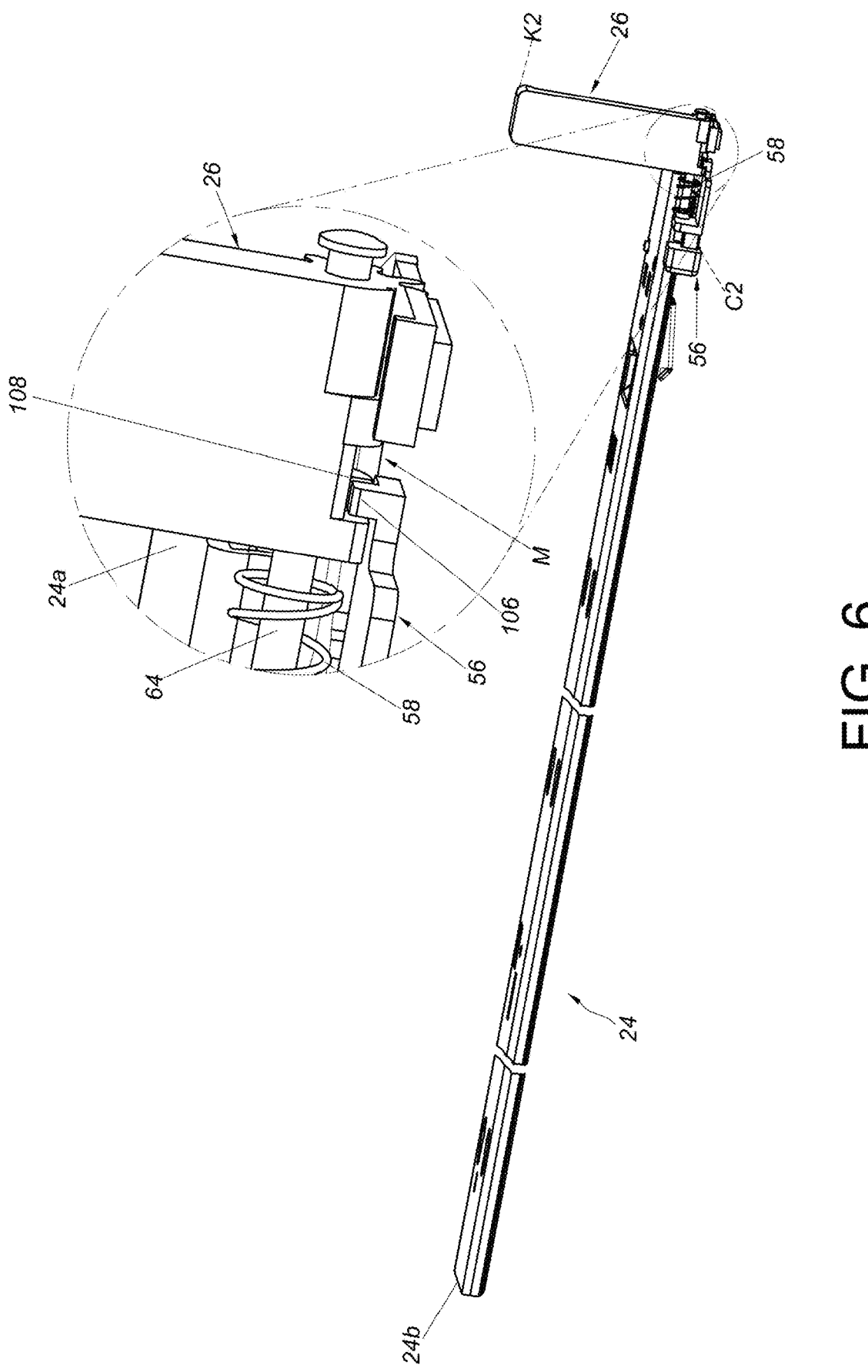
FIG. 6 is a diagram showing the second rail and the handle being in the second state from another viewing angle according to an embodiment of the present invention.

As shown in FIG. 5 and FIG. 6, the handle 26 is moved (such as pulled) by the user to switch from the first state K1 to a second state K2 (such as being rotated by 90 degrees). On the other hand, when the force F is no longer applied to the auxiliary member 56 or when the auxiliary member 56 is moved away from the object (such as the first rail 22), the elastic feature 58 is configured to release the predetermined elastic force J to apply to the auxiliary member 56, such that the auxiliary member 56 is driven to move from the first auxiliary position C1 to a second auxiliary position C2 relative to the second rail 24 (for example, the auxiliary member 56 is moved to the second auxiliary position C2 along a direction toward the second end part 24b of the second rail 24, but the present invention is not limited thereto), and the engaging feature 106 of the auxiliary member 56 is moved away from the predetermined space M of the handle 26 to be engaged with (or blocked by) a predetermined part 108 of the handle 26. In other words, the engaging feature 106 of the auxiliary member 56 is configured to block a moving path of the handle 26 to prevent handle 26 from returning to the first state K1 from the second state K2, so as to hold the handle 26 in the second state K2.

Furthermore, please refer to FIG. 3 and FIG. 5. During a process of the handle 26 being moved to switch from the first state K1 (as shown in FIG. 3) to the second state K2 (as shown in FIG. 5), the handle 26 is configured to drive the actuating member 62 to rotate through the gear structure 66 meshing with the gear rack 60, and the actuating member 62 is configured to further push the driving member 70 to move longitudinally (or linearly) from a first driving position N1 (as shown in FIG. 3) to a second driving position N2 (as shown in FIG. 5) along the direction toward the second end part 24b of the second rail 24, such that the driving member 70 is configure to drive the locking member 80 to move (such as rotate) to switch from a locking state L1 (as shown in FIG. 3) to an unlocking state L2 (as shown in FIG. 5) through the first corresponding feature 86 interacting with the second corresponding feature 88.

In addition, during a process of the driving member 70 being moved from the first driving position N1 to the second driving position N2, the driving member 70 is configured to drive the operating member 94 to move from a first operating position B1 (as shown in FIG. 3) to a second operating position B2 (as shown in FIG. 5) relative to the second rail 24, in order to further drive the second working member 92 to move to switch from the first working state S1 (as shown in FIG. 3) to the second working state (as shown in FIG. 5). In such state, the second elastic section 99b is configured to accumulate an elastic force (as shown in FIG. 5).

Moreover, the handle 26, the gear rack 60, the actuating member 62, the driving member 70, the locking member 80, the operating member 94 and the second working member 92 are configured to work interactively with each other. When the auxiliary member 56 is located at the second auxiliary position C2, the handle 26 is held in the second state K2 (as shown in FIG. 6) due to the locking feature 106 of the auxiliary member 56 being engaged with the predetermined part 108 of the handle 26. As such, positions or states of the gear rack 60, the actuating member 62, the driving member 70, the locking member 80, the operating member 94 and the second working member 92 are all maintained, and the elastic member 76 is configured to accumulate an elastic force Q (as shown in FIG. 5, the elastic member 76 accumulates a returning elastic force) in response to the driving member 70 being held at the second driving position N2. In other words, when the auxiliary member 56 is moved from the second auxiliary position C2 (as shown in FIG. 5) to return to the first auxiliary position C1 (as shown in FIG. 3), the engaging feature 106 of the auxiliary member 56 is no longer engaged with the predetermined part 108 of the handle 26 (for example, the engaging feature 106 of the auxiliary member 56 is located at the position corresponding to the predetermined space M of the handle 26 again), such that the elastic member 76 releases the elastic force Q to drive the handle 26, the gear rack 60, the actuating member 62, the driving member 70, the locking member 80, the operating member 94 and the second working member 92 to return to initial positions or states (as shown in FIG. 3).

Figure 7:
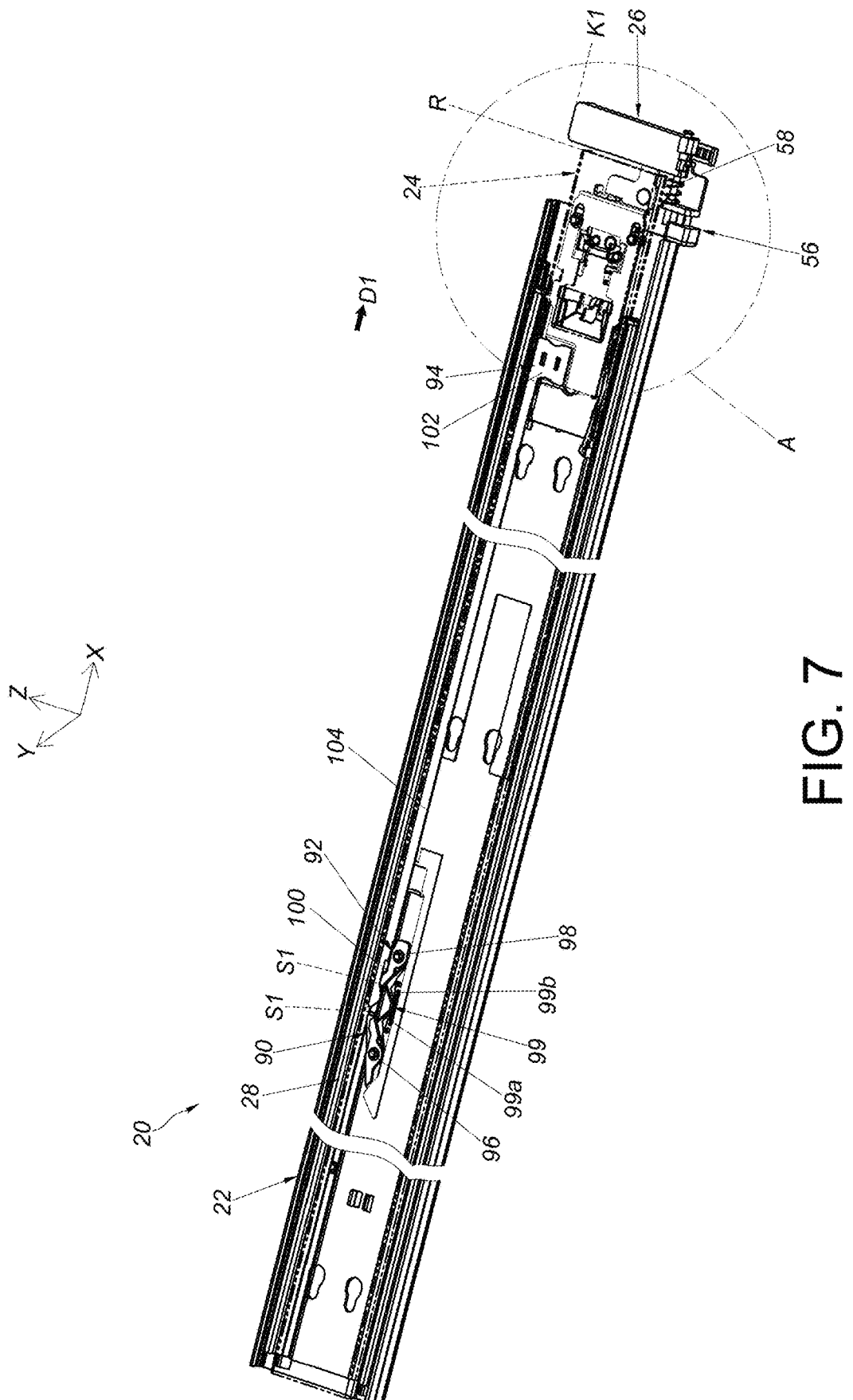
FIG. 7 is a diagram showing the slide rail assembly being in a retracted state, and the handle being in the first state according to an embodiment of the present invention.
Figure 8:
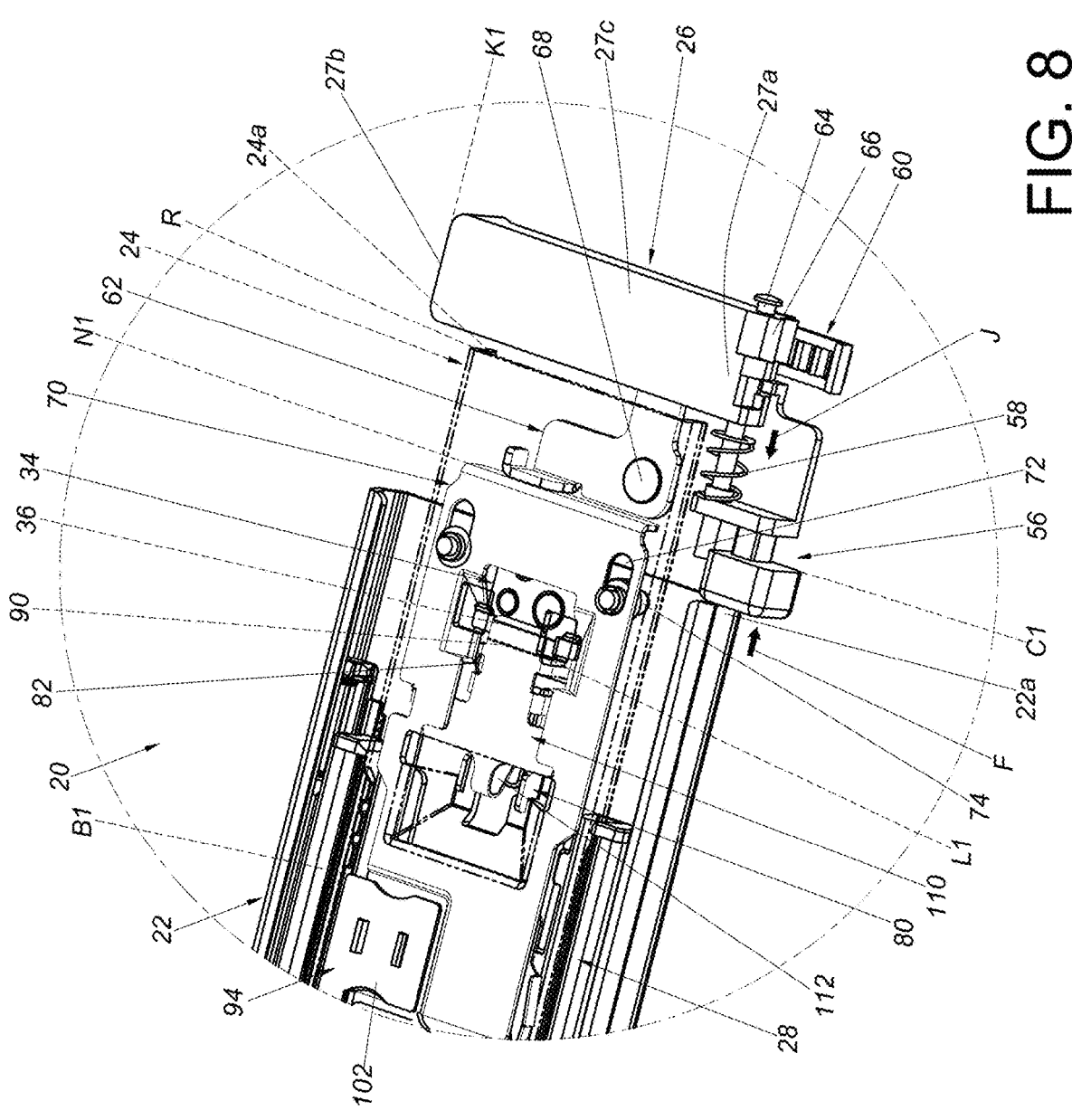
FIG. 8 is an enlarged view of an area A of FIG. 7.

Please refer to FIG. 7 and FIG. 8 (the housing 54 is omitted in FIGS. 7 and 8). Preferably, the slide rail assembly 20 further comprises an auxiliary elastic member 110, and the locking member 80 is configured to be held in the locking state L1 in response to 80 an elastic force of an extension section 112 of the auxiliary elastic member 110. The slide rail assembly 20 is in a retracted state in FIG. 7 and FIG. 8. The first rail 22 is configured to be mounted to a rack (or a cabinet), and the second rail 24 is configured to carry a carried object. Such configuration is well known to those skilled in the art, for simplification, no further illustration is provided.

Preferably, when the second rail 24 is located at the retracted position R relative to the first rail 22, the locking part 90 of the locking member 80 in the locking state L1 (please also refer to FIG. 3) is configured to be blocked by the blocking section 36 of the blocking part 34 of the first rail 22 (please also refer to FIG. 2) to prevent the second rail 24 from being moved from the retracted position R along an opening direction D1. In addition, the auxiliary member 56 abuts against a portion of the first rail 22 (such as abutting against the first end part 22a of the first rail 22, but the present invention is not limited thereto) to generate an acting force as the force F applied to the auxiliary member 56, and the elastic feature 58 accumulates the predetermined elastic force J.

Figure 9:
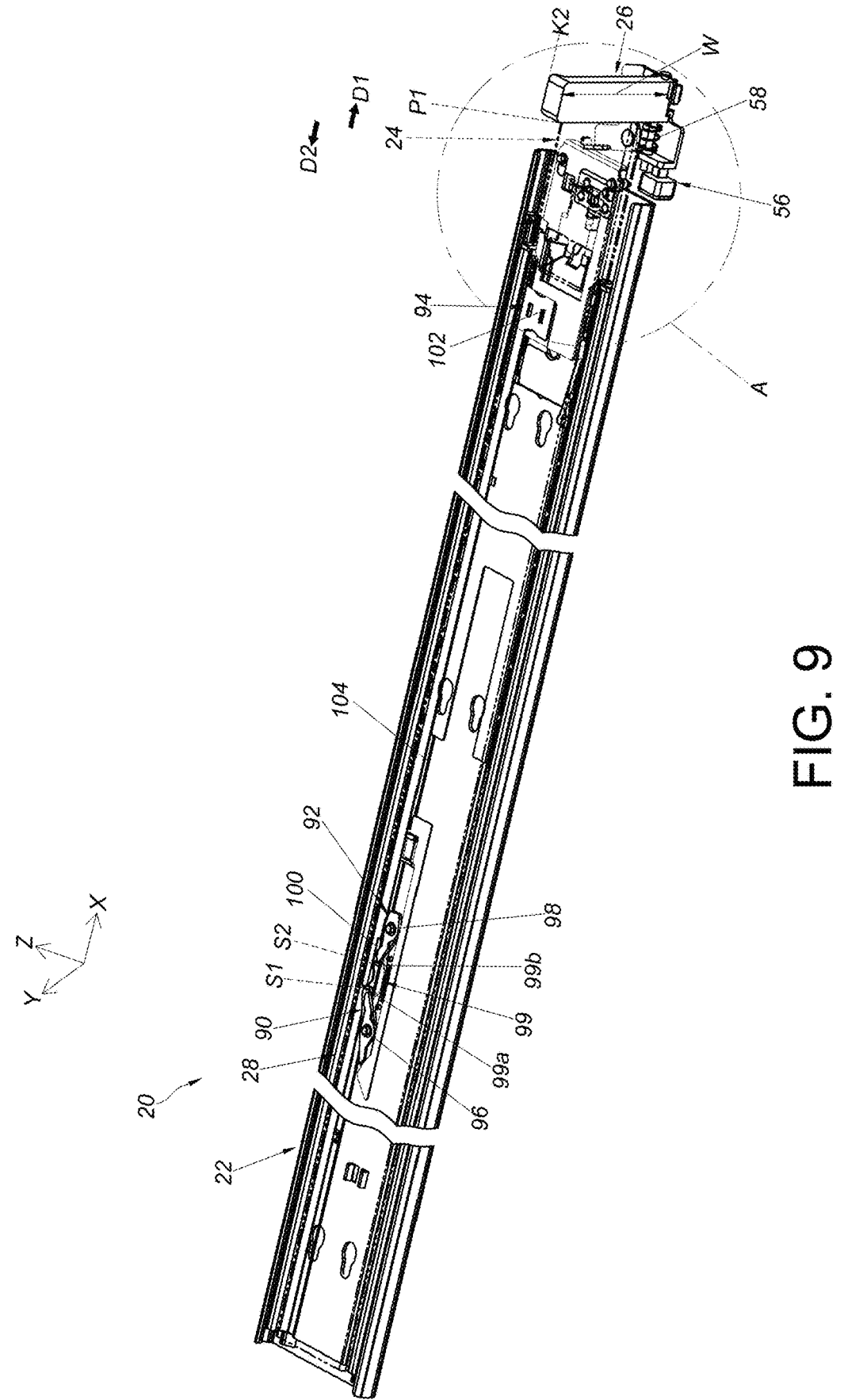
FIG. 9 is a diagram showing the slide rail assembly being in the retracted state, and the handle being in the second state according to an embodiment of the present invention.
Figure 10:
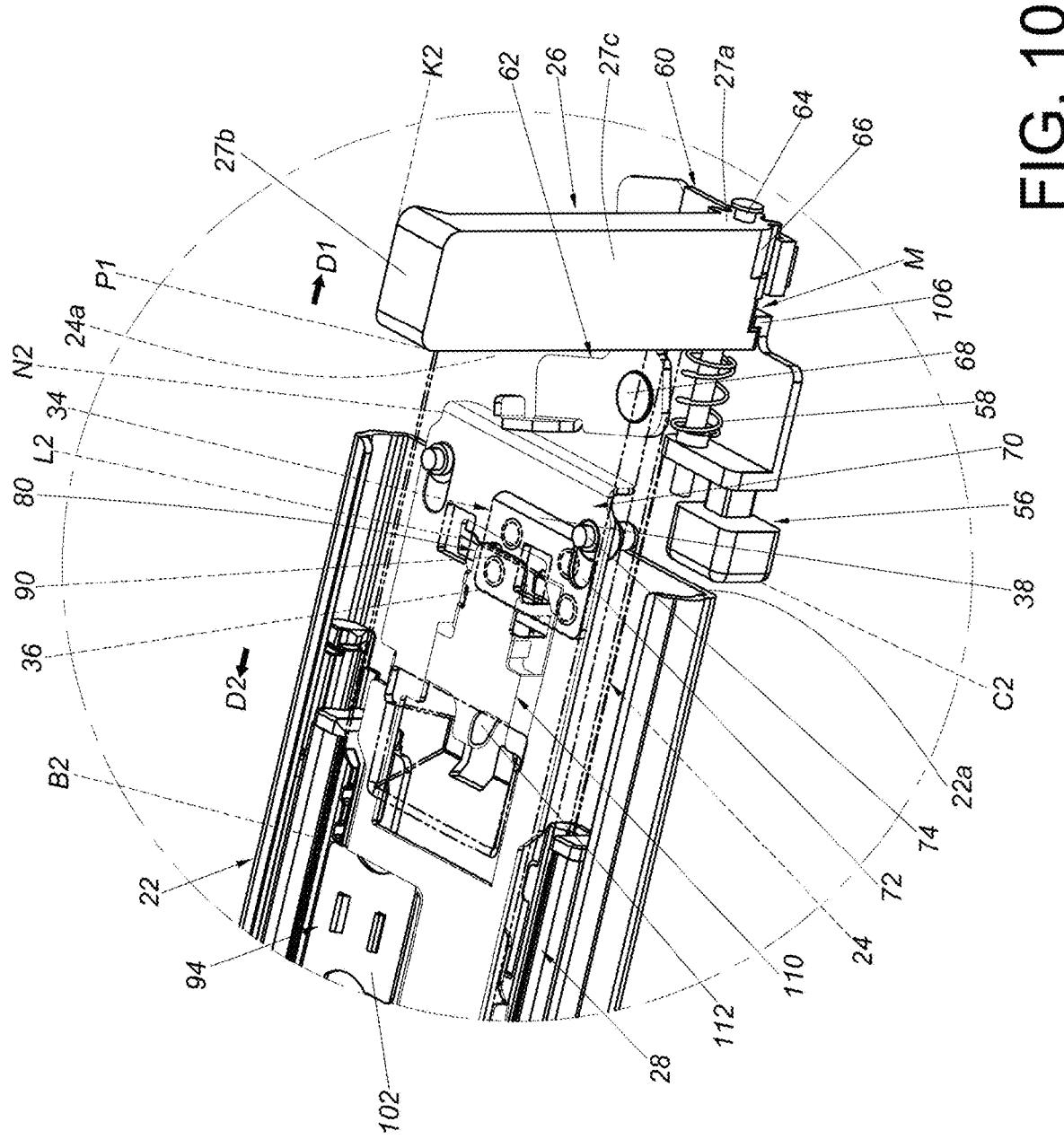
FIG. 10 is an enlarged view of an area A of FIG. 9.

As shown in FIG. 7 to FIG. 10, when the handle 26 is moved by the user to switch from the first state K1 to the second state K2, the second rail 24 is movable from the retracted position R (as shown in FIG. 7 and FIG. 8) to a predetermined extended position P1 (as shown in FIG. 9 and FIG. 10) along the opening direction D1. When the second rail 24 is located at the predetermined extended position P1 relative to the first rail 22, the elastic feature 58 is configured to release the predetermined elastic force J to the auxiliary member 56, such that the auxiliary member 56 is moved from the first auxiliary position C1 (as shown in FIG. 8) to the second auxiliary position C2 (as shown in FIG. 10), and the engaging feature 106 of the auxiliary member 56 is configured to be engaged with the handle 26 (the predetermined part 108 of the handle 26) in order to hold the handle 26 in the second state K2 (as shown in FIG. 9 and FIG. 10).

Preferably, in the present embodiment, the locking member 80 in the locking state L1 is configured to be blocked by the blocking part 34 (the blocking section 36 of the blocking part 34). If the user is going to move the second rail 24 away from the retracted position R relative to the first rail 22, the user can operate (such as pull) the handle 26 to move (or rotate) from the first state K1 (as shown in FIG. 7 and FIG. 8) to the second state K2 (as shown in FIG. 9 and FIG. 10). During a process of the handle 26 being moved to switch from the first state K1 to the second state K2, the handle 26, the gear rack 60, the actuating member 62 and the driving member 70 are configured to work interactively with each other (such configuration has been disclosed in FIG. 3 to FIG. 6 and related description, for simplification, no further illustration is provided). As such, the driving member 70 is configured to further drive the locking member 80 to overcome the elastic force of the extension section 112 of the auxiliary elastic member 110, in order to move the locking member 80 to switch from the locking state L1 (as shown in FIG. 3, FIG. 7 and FIG. 8) to the unlocking state L2 (as shown in FIG. 5, FIG. 9 and FIG. 10), such that the locking member 80 (the locking part 90 of the locking member 80) is no longer blocked by the blocking part 34 (the blocking section 36 of the blocking part 34). For example, the locking member 80 (the locking part 90 of the locking member 80) is transversely (laterally) offset from the blocking part 34 (the blocking section 36 of the blocking part 34) in order to allow the second rail 24 to move from the retracted position R relative to the first rail 22 along the opening direction D1, such as moving to the predetermined extended position P1 (as shown in FIG. 9 and FIG. 10).

Furthermore, when the second rail 24 is located at the predetermined extended position P1 relative to the first rail 22 (as shown in FIG. 9 and FIG. 10), the auxiliary member 56 no longer abuts against the first rail (the first end part 22a of the first rail 22). That is, the force F is no longer applied to the auxiliary member 56, such that the auxiliary member is moved from the first auxiliary position C1 to the second auxiliary position C2 in response to the predetermined force J released by the elastic feature 58, and the engaging feature 106 of the auxiliary member 56 is configured to be engaged with the handle 26 (the predetermined part 108 of the handle 26) in order to hold the handle 26 in the second state K2 (as shown in FIG. 9 and FIG. 10). Thereby, positions or states of the gear rack 60, the actuating member 62, the driving member 70, the locking member 80, the operating member 94 and the second working member 92 are maintained. For example, the driving member 70 is held at the second driving position N2, the locking member 80 is held in the unlocking state L2, the operating member 94 is held at the second operating position B2, and the second working member 92 is held in the second working state S2 (as shown in FIG. 9 and FIG. 10). In the meantime, the elastic member 76 is configured to accumulate the elastic force Q (please also refer to FIG. 5).

Figure 11:
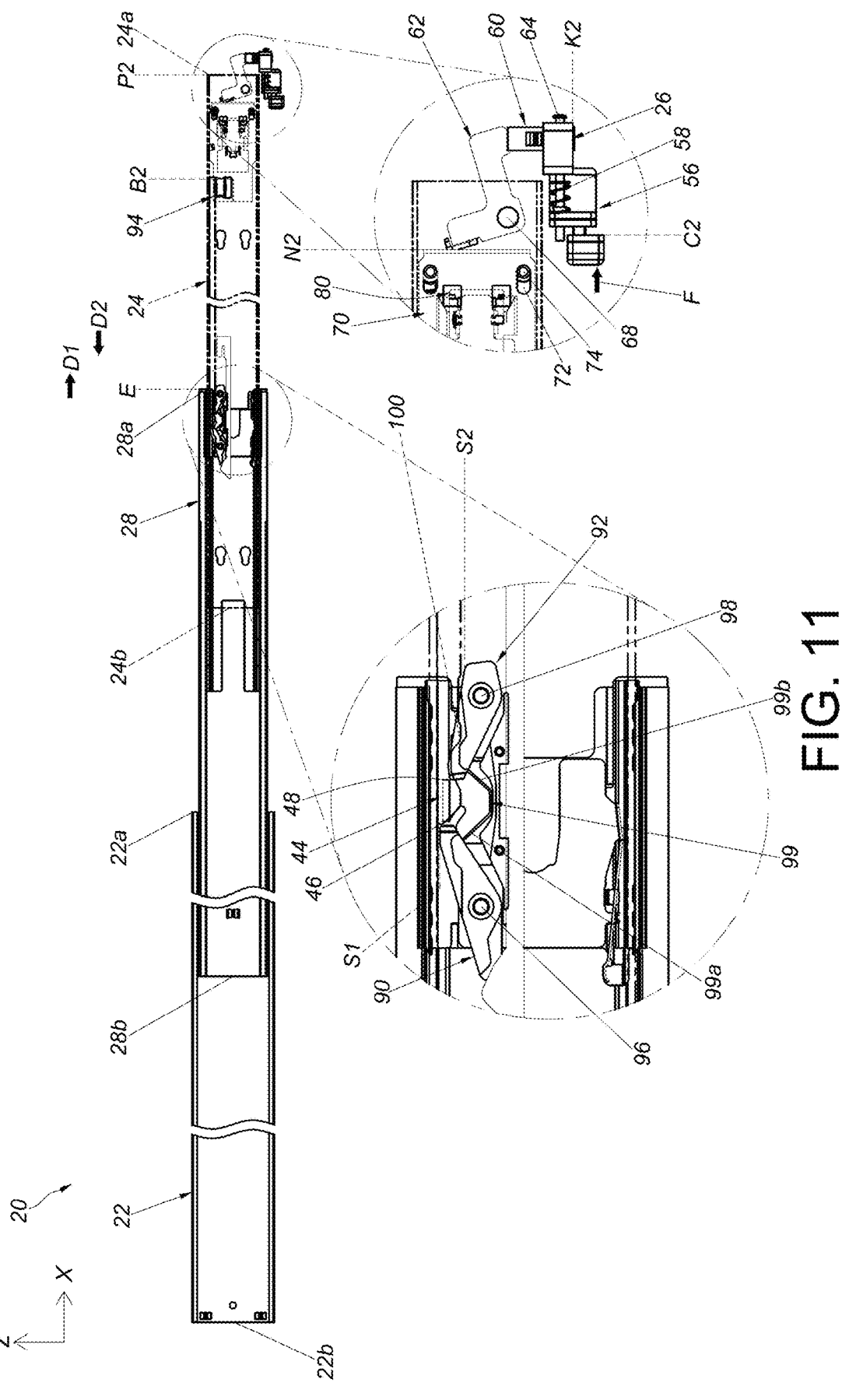
FIG. 11 is a diagram showing the slide rail assembly being in an extended state, and a working member on the second rail being not blocked by the third rail according to an embodiment of the present invention.

As shown in FIG. 11, the third rail 28 is located at a predetermined opening position E relative to the first rail 22, such that the first end part 28a of the third rail 28 is extended beyond the first end part 22a of the first rail 22 by a predetermined distance, and the third rail 28 is configured to be held in the predetermined opening position E relative to the first rail 22 by a positioning mechanism (such configuration is well known to those skilled in the art, for simplification, no further illustration is provided).

Moreover, when the second rail 24 is further moved relative to the third rail 28 (or the first rail 22) along the opening direction D1 to a fully extended position P2, the first working member 90 in the first working state S1 and the first blocking wall 46 of the blocking feature 44 are configured to block each other in order to prevent the second rail 24 from being further moved along the opening direction D1 from the fully extended position P2, and the second working member 92 in the second working state S2 and the second blocking wall 48 of the blocking feature 44 do not block each other in order to allow the second rail 24 to be moved from the fully extended position P2 along a retracting direction D2. When the second rail 24 is located at the fully extended position P2 relative to the third rail 28 (or the first rail 22), the first end part 24a of the second rail 24 is extended beyond the first end part 28a of the third rail 28 by a predetermined distance.

Figure 12:
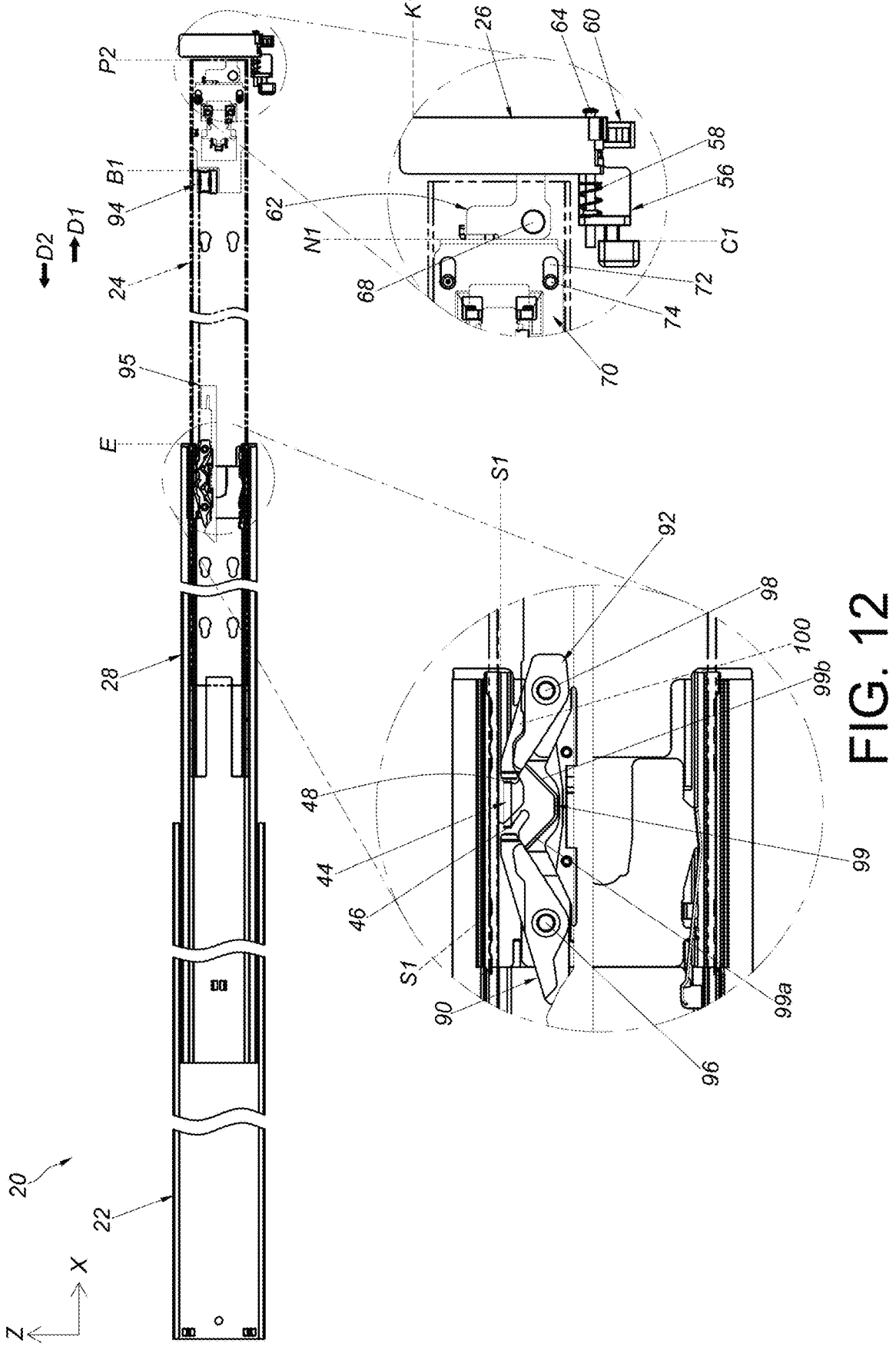
FIG. 12 is a diagram showing the slide rail assembly being in the extended state, and the working member on the second rail being blocked by the third rail according to an embodiment of the present invention.

As shown in FIG. 11 and FIG. 12, when the second rail 24 is located at the fully extended position P2 relative to the third rail 28, and when the user is going to hold the second rail 24 at the fully extended position P2 relative to the third rail 28, the user can apply the force F to the auxiliary member 56 (for example, the user can press the auxiliary member 56) to move the auxiliary member 56 from the second auxiliary position C2 (as shown in FIG. 11) back to the first auxiliary position C1 (as shown in FIG. 12), such that the auxiliary member 56 is no longer engaged with the handle 26. For example, the engaging feature 106 of the auxiliary member 56 is located at the position corresponding to the predetermined space M of the handle 26 (please also refer to FIG. 4 and related description), such that the handle 26 is configured to return to the first state K1 (as shown in FIG. 12) from the second state K2 (as shown in FIG. 11) in response to the elastic force Q released by the elastic member 76, and the driving member 70 is configured to drive the operating member 94 to move from the second operating position B2 (as shown in FIG. 11) to return to the first operating position B1 (as shown in FIG. 12) in response to the elastic force Q released by the elastic member 76, so as to allow the second working member 92 to be moved to switch from the second working state S2 (as shown in FIG. 11) to the first working state S1 (as shown in FIG. 12). Preferably, the second working member 92 is configured to be moved to switch from the second working state S2 to the first working state S1 in response to the elastic force released by the second elastic section 99b. The second working member 92 in the first working state S1 and the second blocking wall 48 of the blocking feature 44 are configured to block each other in order to prevent the second rail 24 from being moved from the fully extended position P2 along the retracting direction D2 (as shown in FIG. 12). In other words, the first working member 90 in the first working state S1 and the second working member 92 in the first working state S1 are configured to be blocked by the first blocking wall 46 and the second blocking wall 48 of the blocking feature 44 respectively in order to prevent the second rail 24 from being moved away from the fully extended position P2 (as shown in FIG. 12).

Moreover, when the user is going to move the second rail away from the fully extended position P2, the user can operate the operating member 94 to drive the second working member 92 to move to switch from the first working state S1 (as shown in FIG. 12) to the second working state S2 (as shown in FIG. 11) in order to allow the second rail 24 to be moved from the fully extended position P2 along the retracting direction D2; or, the user can operate another operating member 95 to drive the first working member 90 to move to switch from the first working state S1 to the second working state S2 in order to allow the second rail 24 to be moved from the fully extended position P2 along the opening direction D1 to be further detached from the third rail 28.

In addition, when the second rail 24 is moved from an extended position (such as the predetermined extended position P1 as shown in FIG. 9 and FIG. 10, or the fully extended position P2) along the retracting direction D2 to return to the retracted position R without the force F being applied to the auxiliary member 56, the auxiliary member 56 is configured to abut against the first rail 22 again to be moved from the second auxiliary position C2 (as shown in FIG. 9 and FIG. 10) to return to the first auxiliary position C1 (as shown in FIG. 7 and FIG. 8), such that the elastic feature 58 is configured to accumulate the predetermined elastic force J again, and the auxiliary member 56 is no longer engaged with the handle 26 to allow the handle 26 to return to the first state K1 from the second state K2. Preferably, the handle 26 is configured to return to the first state K1 from the second state K2 in response to the elastic force Q released by the elastic member 76, and the locking member 80 is configured to be blocked by the blocking part 34 again in order to prevent the second rail 24 from being moved away from the retracted position R (as shown in FIG. 7 and FIG. 8).

Preferably, the second rail has an outer side and an inner side opposite to each other. The outer side of the second rail 24 is adjacent to or faces toward the first rail 22. The handle 26 comprises a first end 27a, a second end 27b and an operating section 27c connected between the first end 27a and the second end 27b (as shown in FIG. 8 or FIG. 10). The shaft member 64 is arranged adjacent to the first end 27a. When the handle 26 is in the second state K2, the operating section 27c of the handle 26 is extended beyond the inner side of the second rail 24 by a predetermined distance W (as shown in FIG. 9 and FIG. 10), so as to allow the user to easily hold the handle 26 to pull the second rail 24 out relative to the first rail 22 along the opening direction D1.

Preferably, when the handle 26 is in the first state K1 (as shown in FIG. 7), the handle 26 is arranged in a direction substantially identical to the height direction of the second rail 24 (such as the Z axis); and when the handle 26 is in the second state K2 (as shown in FIG. 9), the handle 26 is arranged in a direction substantially identical to the transverse direction of the second rail 24 (such as the Y axis).

Preferably, the moving direction of the second rail 24 relative to the first rail 22, the height direction of the second rail 24 and the transverse direction of the second rail 24 are perpendicular to each other.

Therefore, the slide rail assembly 20 according to the embodiments of the present invention has the following technical features:

1. The operating member 92 and the handle 92 are configured to interactively work with each other, so as to improve convenience and functionality of the slide rails of the slide rail assembly 20.

2. When the second rail 24 is located at the fully extended position P2 relative to the third rail 28, the user can apply the force F to press the auxiliary member 56, such that the auxiliary member 56 is moved from the second auxiliary position C2 to the first auxiliary position C1, and the auxiliary part 56 is no longer engaged with the handle 26. The handle 26 is configured to return to the first state K1 from the second state K2 in response to the elastic force Q of the elastic member 76, and the driving member 70 is configured to drive the operating member 94 to move from the second operating position B2 to the first operating position B1 in response to the elastic force Q of the elastic member 76 in order to allow the second working member 92 to be moved from the second operating state S2 to the first working state S1. The second working member 92 in the first working state S1 and the second blocking wall 48 of the blocking feature 44 are configured to block each other in order to prevent the second rail 24 from being moved away from the fully extended position P2 along the retracting direction D2.

3. When the second rail 24 is located at the retracted position R relative to the first rail 22, the auxiliary member 56 is configured to abut against the first rail 22 to be located at the first auxiliary position C1, such that the elastic feature 58 is configured to accumulate the predetermined elastic force J. When the handle 26 is moved to switch from the first state K1 to the second state K2, the second rail 24 is movable from the retracted position R to the predetermined extended position P1 along the opening direction D1. When the second rail 24 is located at a predetermined extended position (such as the predetermined extended position P1) relative to the first rail 22, the elastic feature 58 is configured to release the predetermined elastic force J to apply to the auxiliary member 56, such that the auxiliary member 56 is moved from the first auxiliary position C1 to the second auxiliary position C2 to be engaged with the handle 26 in order to hold the handle 26 in the second state K2.

4. When the second rail 24 is moved from an extended position (such as the predetermined extended position P1 or the fully extended position P2) along the retracting direction D2 to return to the retracted position R, the auxiliary member 56 is configured to abut against the first rail 22 again to be moved from the second auxiliary position C2 to return to the first auxiliary position C1, such that the elastic feature 58 is configured to accumulate the predetermined elastic force J, and the auxiliary member 56 is no longer engaged with the handle 26 to allow the handle 26 to return to the first state K1 from the second state K2. Preferably, the handle 26 is configured to return to the first state K1 from the second state K2 in response to the elastic force Q of the elastic member 76.

5. When the second rail 24 is located at the retracted position R relative to the first rail 22, the locking member 80 is configured to be blocked by the blocking part 34 in order to prevent the second rail 24 from being moved away from the retracted position R along the opening direction D1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A slide rail assembly, comprising:
a first rail;
a second rail movable relative to the first rail;
a third rail movably mounted between the first rail and the second rail, wherein the third rail is arranged with a blocking feature, and the blocking feature has a first blocking wall and a second blocking wall;

a first working member and a second working member movably mounted to the second rail and configured to be in one of a first working state and a second working state;

an operating member configured to drive the second working member to move; and a handle movable relative to the second rail to switch between a first state and a second state;

wherein during a process of the handle being moved to switch from the first state to the second state, the operating member is configured to be moved from a first operating position to a second operating position in order to further drive the second working member to move to switch from the first working state to the second working state;

wherein when the third rail is located at a predetermined opening position relative to the first rail and when the second rail is moved relative to the third rail along an opening direction to a fully extended position, the first working member in the first working state and the first blocking wall of the blocking feature are configured to block each other in order to prevent the second rail from being further moved along the opening direction from the fully extended position, and the second working member in the second working state and the second blocking wall of the blocking feature do not block each other in order to allow the second rail to be moved from the fully extended position along a retracting direction;

wherein the handle is pivoted relative to the second rail through a shaft member, the second rail has an outer side and an inner side opposite to each other, the outer side of the second rail faces toward the first rail, the handle comprises a first end, a second end and an operating section connected between the first end and the second end, and the shaft member is arranged adjacent to the first end; wherein when the handle is in the second state, the operating section of the handle is extended beyond the inner side of the second rail by a predetermined distance.

2. The slide rail assembly of claim 1, further comprising an auxiliary member arranged on the second rail, and an elastic feature; wherein when the second rail is located at a retracted position relative to the first rail, the auxiliary member is configured to abut against the first rail to be located at a first auxiliary position relative to the second rail, and the elastic feature is configured to accumulate a predetermined elastic force; wherein when the handle is moved to switch from the first state to the second state, the second rail is movable from the retracted position to a predetermined extended position along the opening direction; wherein when the second rail is located at the predetermined extended position relative to the first rail, the elastic feature is configured to release the predetermined elastic force to the auxiliary member, such that the auxiliary member is driven to move from the first auxiliary position to a second auxiliary position relative to the second rail to be engaged with the handle in order to hold the handle in the second state.

3. The slide rail assembly of claim 2, wherein when the second rail is located at the fully extended position relative to the third rail and when a force is applied to the auxiliary member to move the auxiliary member back to the first auxiliary position from the second auxiliary position, the auxiliary member is not engaged with the handle, such that the handle is configured to return to the first state from the second state in response to an elastic force of an elastic member, and the operating member is driven to move from the second operating position to return to the first operating position in order to allow the second working member to be moved to switch from the second working state to the first working state, and the second working member in the first working state and the second blocking wall of the blocking feature are configured to block each other in order to prevent the second rail from being moved from the fully extended position along the retracting direction.

4. The slide rail assembly of claim 3, further comprising at least one auxiliary elastic part, wherein the first working member and the second working member are configured to be held in the first working state in response to an elastic force of the at least one auxiliary elastic part.

5. The slide rail assembly of claim 2, wherein when the second rail returns to the retracted position from the predetermined extended position along the retracting direction, the auxiliary member is configured to abut against the first rail again to be moved from the second auxiliary position to return to the first auxiliary position relative to the second rail, such that the elastic feature is configured to accumulate the predetermined elastic force, and the auxiliary member is no longer engaged with the handle to allow the handle to return to the first state from the second state.

6. The slide rail assembly of claim 5, wherein the first rail comprises a blocking part, and the slide rail assembly further comprises a locking member movably mounted on the second rail; wherein when the second rail is located at the retracted position relative to the first rail, the locking member is configured to be blocked by the blocking part in order to prevent the second rail from being moved from the retracted position along the opening direction.

7. The slide rail assembly of claim 6, further comprising an actuating member movable relative to the second rail; wherein during the process of the handle being moved to switch from the first state to the second state, the handle is configured to drive the actuating member to move to further move the locking member to be no longer blocked by the blocking part, in order to allow the second rail to be moved from the retracted position along the opening direction.

8. The slide rail assembly of claim 7, further comprising a driving member movable relative to the second rail; wherein during the process of the handle being moved to switch from the first state to the second state, the handle is configured to drive the actuating member to move, and the actuating member is configured to further drive the locking member to move through the driving member, such that the locking member is no longer blocked by the blocking part, in order to allow the second rail to be moved from the retracted position along the opening direction.

9. The slide rail assembly of claim 8, wherein the operating member is connected to the driving member.

10. The slide rail assembly of claim 9, wherein the operating member comprises a driving section, an operating section and a longitudinal section connected between the driving section and the operating section; the driving section is configured to drive the second working member to move, and the operating section is connected to the driving member.

11. The slide rail assembly of claim 8, further comprising a gear rack movable relative to the second rail; wherein the handle is arranged with a gear structure; wherein during the process of the handle being moved to switch from the first state to the second state, the handle is configured to drive the actuating member to move through the gear structure meshing with the gear rack, and the actuating member is configured to further drive the locking member to move through the driving member, such that the locking member is no longer blocked by the blocking part, in order to allow the second rail to be moved from the retracted position along the opening direction.

12. The slide rail assembly of claim 7, wherein when the second rail is moved from the predetermined extended position along the retracting direction to return to the retracted position, the auxiliary member is configured to abut against the first rail again to be moved from the second auxiliary position to return to the first auxiliary position, such that the elastic feature is configured to accumulate the predetermined elastic force, the auxiliary member is no longer engaged with the handle in order to allow the handle to return to the first state from the second state, and the locking member is configured to be blocked by the blocking member again in order to prevent the second rail from being moved away from the retracted position.

13. The slide rail assembly of claim 1, wherein the shaft member is arranged in a direction substantially identical to a moving direction of the second rail relative to the first rail.

14. The slide rail assembly of claim 13, wherein when the handle is in the first state, the handle is arranged in a direction substantially identical to a height direction of the second rail;

wherein when the handle is in the second state, the handle is arranged in a direction substantially identical to a transverse direction of the second rail.

15. The slide rail assembly of claim 13, wherein the moving direction of the second rail relative to the first rail, the height direction of the second rail and the transverse direction of the second rail are perpendicular to each other.

16. The slide rail assembly of claim 8, wherein during the process of the handle being moved to switch from the first state to the second state, the driving member is driven to move to further drive the operating member to move from the first operating position to the second operating position, in order to drive the second working member to move to switch from the first working state to the second working state.

17. The slide rail assembly of claim 1, wherein the first working member and the second working member are pivoted to the second rail through a first mounting shaft and a second mounting shaft respectively.

18. The slide rail assembly of claim 6, wherein the locking member is pivoted to the second rail through an auxiliary shaft.

19. The slide rail assembly of claim 18, wherein the auxiliary shaft is arranged in a direction substantially identical to a height direction of the second rail.

20. A slide rail assembly, comprising:
a first rail;
a second rail movable relative to the first rail;
a third rail movably mounted between the first rail and the second rail, wherein the third rail is arranged with a blocking feature, and the blocking feature has a first blocking wall and a second blocking wall;
a first working member and a second working member movably mounted to the second rail and configured to be in one of a first working state and a second working state;
an operating member configured to drive the second working member to move; and
a handle movable relative to the second rail to switch between a first state and a second state;
wherein during a process of the handle being moved to switch from the first state to the second state, the operating member is configured to be moved from a first operating position to a second operating position in order to further drive the second working member to move to switch from the first working state to the second working state;
wherein when the third rail is located at a predetermined opening position relative to the first rail and when the second rail is moved relative to the third rail along an opening direction to a fully extended position, the first working member in the first working state and the first blocking wall of the blocking feature are configured to block each other in order to prevent the second rail from being further moved along the opening direction from the fully extended position, and the second working member in the second working state and the second blocking wall of the blocking feature do not block each other in order to allow the second rail to be moved from the fully extended position along a retracting direction;
wherein the slide rail assembly further comprises an auxiliary member arranged on the second rail, and an elastic feature; wherein when the second rail is located at a retracted position relative to the first rail, the auxiliary member is configured to abut against the first rail to be located at a first auxiliary position relative to the second rail, and the elastic feature is configured to accumulate a predetermined elastic force; wherein when the handle is moved to switch from the first state to the second state, the second rail is movable from the retracted position to a predetermined extended position along the opening direction; wherein when the second rail is located at the predetermined extended position relative to the first rail, the elastic feature is configured to release the predetermined elastic force to the auxiliary member, such that the auxiliary member is driven to move from the first auxiliary position to a second auxiliary position relative to the second rail to be engaged with the handle in order to hold the handle in the second state.

21. A slide rail assembly, comprising:
a first rail;
a second rail movable relative to the first rail;
a third rail movably mounted between the first rail and the second rail, wherein the third rail is arranged with a blocking feature, and the blocking feature has a first blocking wall and a second blocking wall;
a first working member and a second working member movably mounted to the second rail and configured to be in one of a first working state and a second working state;
an operating member configured to drive the second working member to move; and
a handle movable relative to the second rail to switch between a first state and a second state;
wherein during a process of the handle being moved to switch from the first state to the second state, the operating member is configured to be moved from a first operating position to a second operating position in order to further drive the second working member to move to switch from the first working state to the second working state;
wherein when the third rail is located at a predetermined opening position relative to the first rail and when the second rail is moved relative to the third rail along an opening direction to a fully extended position, the first working member in the first working state and the first blocking wall of the blocking feature are configured to block each other in order to prevent the second rail from being further moved along the opening direction from the fully extended position, and the second working member in the second working state and the second blocking wall of the blocking feature do not block each other in order to allow the second rail to be moved from the fully extended position along a retracting direction; 5 wherein the first working member and the second working member are pivoted to the second rail through a first mounting shaft and a second mounting shaft respectively.

* * * * *

10